(12) United States Patent
West

(10) Patent No.: US 8,723,330 B2
(45) Date of Patent: *May 13, 2014

(54) PROTECTIVE LAYER FOR PROTECTING TSV TIPS DURING THERMO-COMPRESSIVE BONDING

(71) Applicant: Texas Instruments Incorporated, Dallas, TX (US)

(72) Inventor: Jeffrey A. West, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 11 days.

This patent is subject to a terminal disclaimer.

(21) Appl. No.: 13/894,536

(22) Filed: May 15, 2013

(65) Prior Publication Data

US 2013/0249098 A1 Sep. 26, 2013

Related U.S. Application Data

(62) Division of application No. 13/150,899, filed on Jun. 1, 2011.

(51) Int. Cl.
*H01L 21/44* (2006.01)

(52) U.S. Cl.
USPC ............... 257/774; 438/667; 257/E21.511

(58) Field of Classification Search
USPC ............... 438/667, 666, 668; 257/773, 774
See application file for complete search history.

(56) References Cited

U.S. PATENT DOCUMENTS

| | | | |
|---|---|---|---|
| 7,407,833 B2* | 8/2008 | Wu | 438/108 |
| 2009/0001543 A1* | 1/2009 | Chung | 257/686 |
| 2009/0278244 A1* | 11/2009 | Dunne et al. | 257/676 |

* cited by examiner

*Primary Examiner* — Reema Patel
(74) *Attorney, Agent, or Firm* — Steven A. Shaw; Wade James Brady, III; Frederick J. Telecky, Jr.

(57) ABSTRACT

A method of protecting through substrate via (TSV) die from bonding damage includes providing a substrate including a plurality of TSV die having a topside including active circuitry, a bottomside, and a plurality of TSVs that include an inner metal core that reaches from the topside to protruding TSV tips that extend out from the bottomside. A protective layer is formed on or applied to the bottomside of the TSV die including between and over the protruding TSV tips. The TSV die is bonded with its topside down onto a workpiece having a workpiece surface and its bottomside up and in contact with a bond head. The protective layer reduces damage from the bonding process including warpage of the TSV die by preventing the bond head from making direct contact to the protruding TSV tips.

4 Claims, 3 Drawing Sheets

PROTECTIVE LAYER FOR PROTECTING TSV TIPS DURING THERMO-COMPRESSIVE BONDING

This application is a Divisional of a claims priority to U.S. application Ser. No. 13/150,899 filed on Jun. 1, 2011. The contents of same are herein incorporated by reference.

FIELD

Disclosed embodiments relate to electronic devices, and more particularly to assembly of integrated circuit (IC) die or a wafer comprising a plurality of die having protruding through substrate via tips to at least one workpiece, and electronic devices therefrom.

BACKGROUND

As known in the art, through-substrate vias (referred to herein as TSVs), which are commonly referred to as through-silicon vias in the case of silicon substrates, are vertical electrical connections that extend the full thickness of the IC die from one of the electrically conductive levels formed on the topside semiconductor surface of the IC die (e.g., contact level or one of the back end of the line (BEOL) metal interconnect levels) to its bottomside surface. Such IC die are referred to herein as "TSV die." The vertical electrical paths are significantly shortened relative to conventional wire bonding technology, generally leading to significantly faster device operation. In one arrangement, the TSVs terminate on the bottomside of the TSV die as protruding TSV tips, such as protruding a distance of 5 to 15 μms from the bottomside substrate (e.g., silicon) surface. To form the protruding tips, the TSV die are commonly thinned in wafer form to expose the TSVs and to form the tips, such as to a die thickness of 25 to 100 μm, using a process generally including backgrinding. The TSV die can be bonded face-up or face-down, and can be bonded to from both of its sides to enable formation of stacked die devices.

In die areas having TSVs, there can be no active devices because TSVs extend the full thickness of the TSV die. TSVs on the TSV die are generally arranged in a plurality of separate TSV arrays that cover a relatively small percentage of the TSV die area, and thus TSVs collectively do not approach uniformly covering the area of the TSV die. The TSVs within the TSV arrays are typically regularly spaced having a fixed pitch. Regions beyond the TSV arrays, or TSV-free regions, result in an irregular bottomside topography caused by the protruding TSV tips being elevated, with the TSV-free regions having a consistent lowest elevation.

The TSV tips may include a metal cap thereon, such as a cap including a nickel comprising layer, that can function as an inter-metallic compound (IMC) barrier to overlying Sn-based solder in the case of solder mediated joints to a workpiece (e.g., a package substrate or another die or a die stack) to avoid, or at least delay, the consumption of the inner metal core (e.g., copper) of the TSV from forming an IMC which can lead to cracking of the outer dielectric sleeve of the TSV, and resulting failures (e.g., leakage or shorts) on the TSV die. The metal cap can significantly increase the height of the TSV tips relative to the TSV-free regions.

Thermo-compression (TC) bonding is a common IC assembly method that involves the use of pressure (e.g., 40 to 80 N/cm$^2$) applied by a bond head and a significant temperature (e.g., a temperature high enough to melt solder, such as 230 to 300° C.) to join two materials by interdiffusion across the boundary of the materials. The TC bonding process relies on pressure to push pillars or other bonding features on the topside surface of TSV die or a TSV wafer against opposing pads on a substrate, wafer or another die that are to be bonded, and to heat and melt the solder. During TC bonding of a thin (e.g., <100 μm thick) TSV die having bottomside TSV tips to a substrate (e.g., package substrate, die, or die stack) in which the topside of the TSV die is bonded to pads on a substrate, the TC bond head comes in direct contact with the TSV tips that protrude far above the surrounding TSV-free regions, effectively resulting in non-uniformly distributed pressure applied to the bonds formed on the topside of the die.

SUMMARY

Disclosed embodiments are based on several recognitions of happenings during TC bonding the topside (active side) of thin TSV die or thin TSV wafers (e.g., <100 μm thick) to a workpiece, where the TSV die or TSV wafers have TSV-free regions across their area on their bottomside. The TSV-free regions have a consistent lowest elevation relative to protruding TSV tips resulting in an irregular bottomside topography than can cause pick-up problems and substantially non-uniformly distributed pressure applied during subsequent bonding operations that can cause problems including die warpage, damage to brittle low-k dielectrics between the TSVs and the bonded topside surface, and cracking of the TSV's dielectric sleeve where the TSV exits the die bottomside.

Regarding pick-up problems, the exposed TSVs on the bottomside of the TSV die or TSV wafer can be damaged during vacuum pick-up, which can lead to poor bond integrity during subsequent bonding of the TSV tip to another workpiece. Moreover, thin TSV die and thin TSV wafers can easily bend when subjected to non-uniformly distributed pressure during bonding. This can lead to intra-die warpage post-bonding that induces non-uniform tensile stresses on the topside bonds which has been found by the Inventor to cause low bond yield to a workpiece, such as an organic substrate, and can also result in degradation of the "co-planarity" of the protruding TSVs that can create problems for subsequent bonding of the collective TSV tips to a workpiece with a nominally co-planar bonding surface.

Disclosed embodiments solve the above-described tip damage problem by adding a protective layer over the protruding TSV tips on the bottomside of the TSV die for reducing or eliminating damage during TC bonding to a workpiece (e.g., organic substrate), which results in a more uniform pressure applied by the TC bond head during TC bonding. Such a protective layer has been found to eliminate or at least significantly reduce TC-bonding induced opens on the bonded topside of the TSV die, and subsequently bonded devices to the bottomside TSV tips of the TSV die. Since disclosed protective layer is on the bottomside of the TSV die, no active die area is lost.

DETAILED DESCRIPTION

Figure 1:
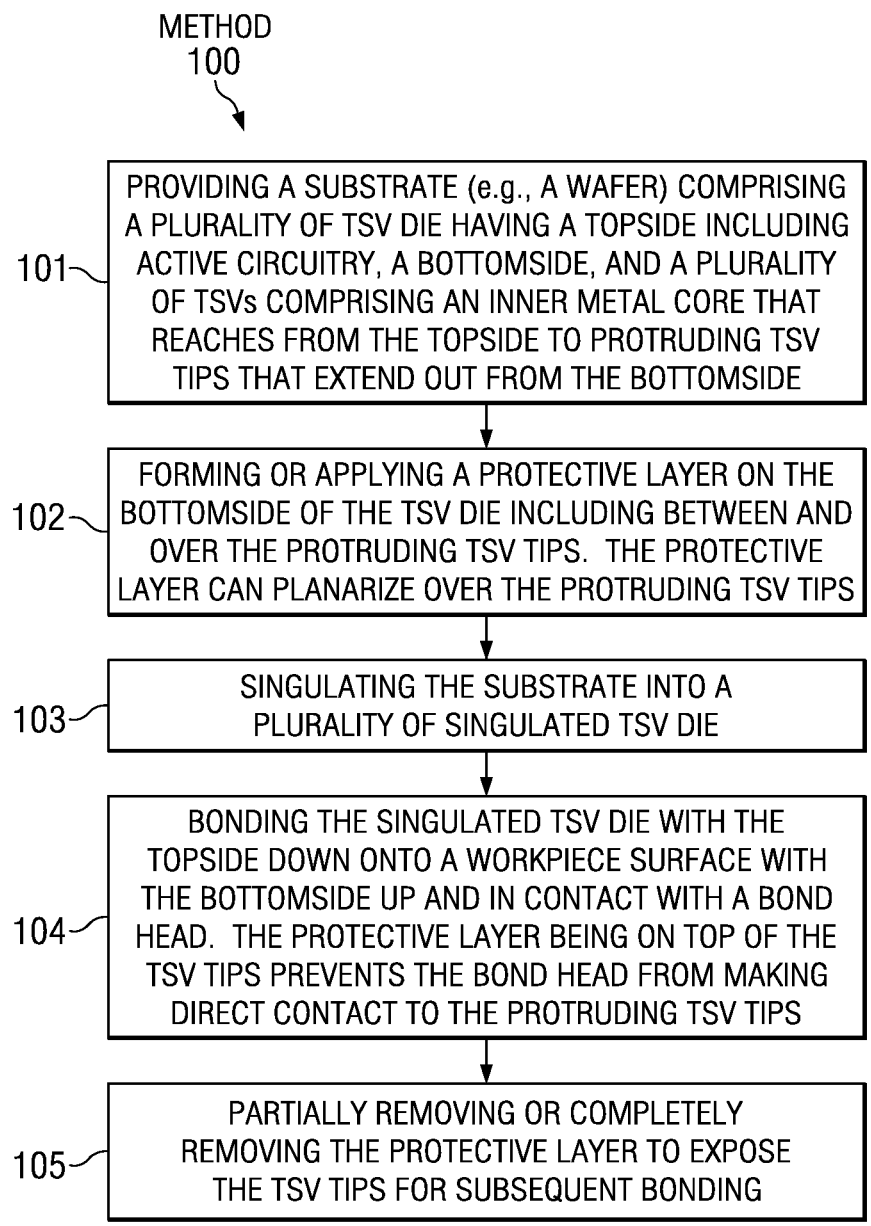
FIG. 1 is a flow chart that shows steps in an example method of protecting TSV die including protruding TSV tips on the bottomside of the TSV die from bonding damage by adding a protective layer between and over the protruding TSV tips, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 of protecting TSV die including protruding TSV tips on the bottomside of the TSV die from bonding damage by adding a protective layer between and over the protruding TSV tips, according to an example embodiment. Step 101 comprises providing a substrate (e.g., a wafer) comprising a plurality of TSV die having a topside including active circuitry, a bottomside, and a plurality of TSVs.

The TSVs include an inner metal core and an outer dielectric sleeve that extends the full thickness of the TSV die from the topside surface (generally coupled to the contact level or one of the back end of the line (BEOL) metal layers (e.g., M1, M2, etc.) to the protruding TSV tips that emerge from the bottomside of the TSV die. In one embodiment a length of the protruding TSV tips measured from the bottomside of the TSV die is from 2 to 15 μm. In one embodiment the TSV diameter is ≤12 μm, such as 4 to 10 μm in one particular embodiment.

The inner metal core can comprise Cu in one embodiment. Other electrically conductive materials can be used for the inner metal core. The outer dielectric sleeve can comprise materials such as silicon oxide, silicon nitride, phosphorus-doped silicate glass (PSG), silicon oxynitride, or certain chemical vapor deposited (CVD) polymers (e.g., parylene). The outer dielectric sleeve is typically 0.2 μm to 5 μm thick.

In the case of copper and certain other metals for the inner metal core, a metal diffusion barrier layer referred to herein as a "TSV barrier" is generally added and is deposited on the dielectric sleeve, such as a refractory metal or a refractory metal nitride. For example, TSV barrier materials can include materials including Ta, W, Mo, Ti, TiW, TiN, TaN, WN, TiSiN or TaSiN, which can be deposited by physical vapor deposition (PVD) or CVD. The TSV barrier is typically 100-500 Å thick.

The TSV tips generally include a metal cap thereon that comprises at least a first metal layer that includes a metal that is not in the inner metal core. The metal layer for the cap is exclusive of solder can be electrolessly or electrolytically deposited (i.e., electroplating) on a distal portion of the protruding TSV tips. The first metal layer forms an electrical contact with at least the topmost surface of the inner metal core of the TSV tip.

The first metal layer can be generally 1 to 8 μm thick. The first metal layer can provide both an IMC block. The first metal layer can comprise materials including Ni, Pd, Ti, Au, Co, Cr, Rh, NiP, NiB, CoWP or CoP, for example. In one specific embodiment, the first metal layer can comprise a 3 to 8 μm thick electroplated Cu plated layer. In one embodiment the inner metal core comprises copper and the TSV tips include a metal cap that includes at least one of Ti, Ni, Pd, and Au. An optional metal barrier layer may also be included between the first metal layer and the distal portion of the TSV tips. For example, a Ti or Ta comprising layer of about 1 kÅ to 3 kÅ may be used as a barrier layer.

The metal caps can include a second metal layer exclusive of solder that is different from the first metal layer. The combined thickness of the first and second metal layers can be 1 μm to 10 μm. One metal cap arrangement comprises Ni/Au.

The substrate (e.g., a wafer) provided in step 101 can also include a first dielectric layer on the bottomside of the substrate between the TSV tips that is generally formed and etched back to expose the TSV tips before the metal caps are formed. For example, in one particular embodiment the TSV tips extend out about 5 μm from the bottomside surface of TSV die, the metal caps 240 add about 5 μm in height to the TSV tips, and the first dielectric layer is about 3 μm thick. In this particular embodiment, the metal capped TSV tips protrude about 7 μm above the first dielectric layer.

Step 102 comprises forming or applying a protective layer on the bottomside of the TSV die including between and over the protruding TSV tips. The protective layer can planarize over protruding TSV tips to provide a substantially planar surface. As defined herein, a "substantially planar surface" has a maximum height range of 1 μm.

In one embodiment the protective layer is a blanket layer that is spun on to cover over the top of existing topography, including over the metal capped TSV tips and the first dielectric layer between the TSV tips described above. In embodiments where a portion of the protective layer remains on the TSV die after step 105 described below, the protective layer is generally a dielectric material. Some exemplary dielectric materials for the protective layer include polymers such as benzocyclobutene (BCB), polybenzoxazole (PBO), and some polyimides (PI) that are formed from photosensitive precursor materials. In this embodiment the protective layer can comprise the same dielectric material as is used for the first dielectric layer so that if desired, the protective layer can be left on the substrate (e.g., wafer) after exposing the TSV tips by partial etchback as described below in step 105. The method can include optionally curing the protective layer in the case of curable protective layer materials to increase the stiffness of the protective layer before bonding (step 104 described below).

In another embodiment the protective layer comprises a metal tape, such as an aluminum tape. A metal tape of suitable material and thickness (e.g., a 15 to 20 μm thick aluminum tape) is readily malleable to provide planarization over the metal capped TSV tips and can be applied and secured to the bottomside of the substrate (e.g., a wafer) including all TSV die on the substrate (e.g., wafer) by a suitable adhesive.

Step 103 comprises singulating the substrate (e.g., wafer) into a plurality of singulated TSV die. Conventional sawing techniques may be used. Step 104 comprises bonding the singulated TSV die with the topside down onto a workpiece surface with the bottomside up and in contact with a bond head. The workpiece can comprise an organic substrate in one embodiment, such as a substrate strip. The bonding can comprise TC bonding that can involve the use of pressure (e.g., 40 to 80 N/cm$^2$) applied by a bond head. As described above, the protective layer being on top of the TSV tips prevents the bond head from making direct contact to the protruding TSV tips such that magnitude of the pressure exerted on TSV tips is reduced by "spreading" bond head contact area to entire die bottomside of the TSV die instead of just the area of the TSV tips.

Step 105 comprises partially removing or completely removing the protective layer to expose the TSV tips for subsequent bonding. Dry etching or ashing can be used for this step. Wet etch processing may also be suitable. If etching is used in step 105 the etch is engineered to be highly selective so that the underfill that is typically between the TSV die and the workpiece (e.g., organic substrate) is not damaged at its exposed periphery during step 105. In the embodiment for which the protective layer comprises a metal tape, the metal tape can be completely removed by a suitable adhesive removal process that does not degrade the underfill between the TSV die and the workpiece.

Significantly, method 100 is applicable to any TC bonder apparatus as the disclosed protective layer is applied to the TSV die and not to the bond head. Moreover, the spreading of the bond head pressure, provided by disclosed protective layer, reduces TC bonding-induced warpage of the TSV die, and can eliminate or at least significantly reduce cracking of the TSV's dielectric sleeve.

Figure 2:
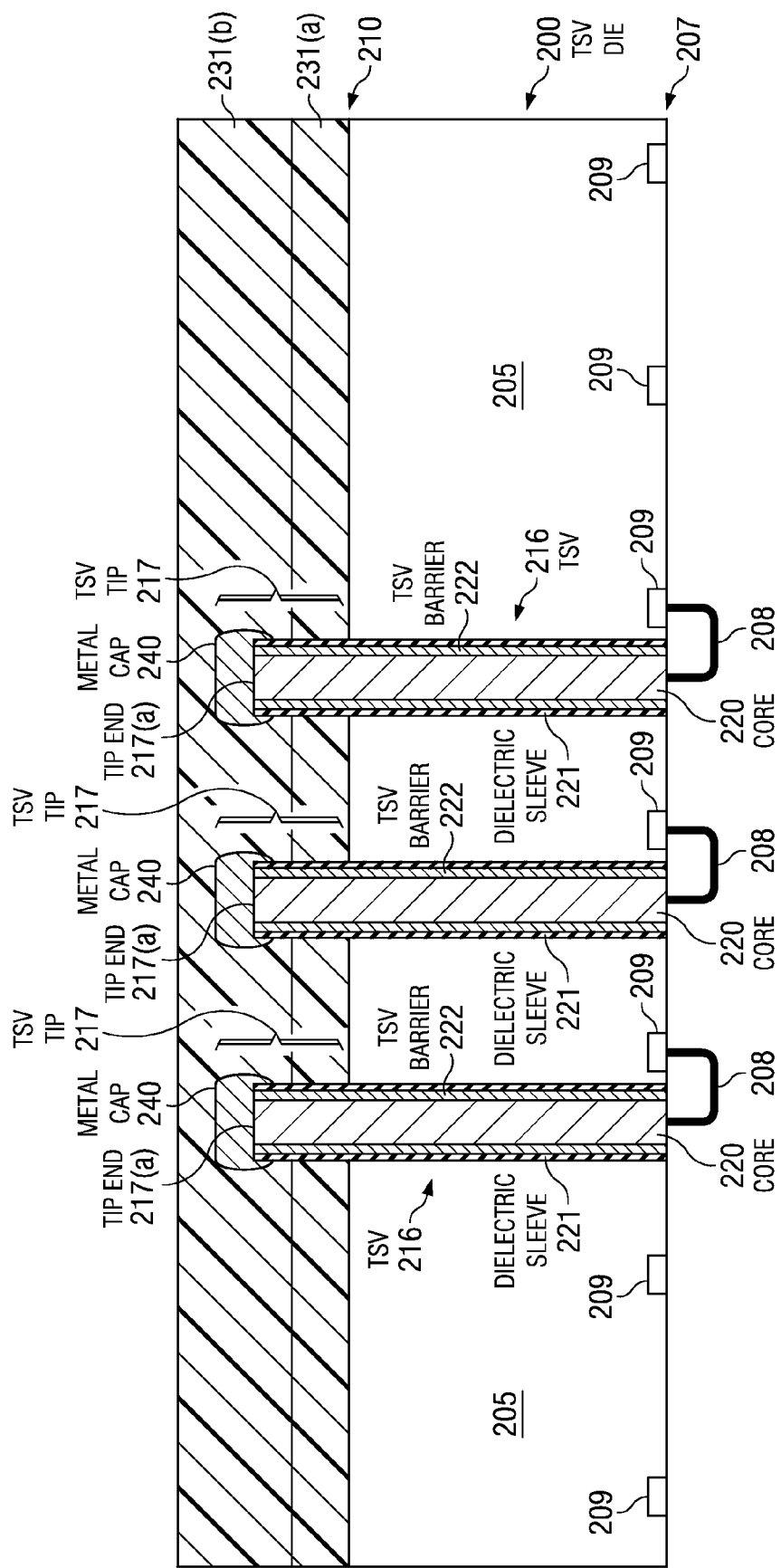
FIG. 2 is a simplified cross-sectional depiction of a TSV die comprising a plurality of TSVs that include protruding TSV tips having a protective layer between and over the protruding TSV tips on the bottomside of the TSV die, according to an example embodiment.

FIG. 2 is a simplified cross-sectional depiction of a TSV die 200 comprising a plurality of TSVs 216 that include protruding TSV tips 217 having a protective layer 231(b) over a first dielectric layer 231(a) between and over the protruding TSV tips 217 on the bottomside 210 of the TSV die, according to an example embodiment. The protruding TSV tips 217 are shown having a metal cap 240 on the distal tip end 217(a).

TSV die 200 comprises a substrate 205 including a topside surface 207 including active circuitry 209 and a bottomside surface 210. The active circuitry 209 on TSV die 200 is configured to provide an IC circuit function, such as a logic function, for example. The connectors 208 shown depict the coupling between the TSVs 216 on the topside surface 207 to the active circuitry 209. The connection to active circuitry 209 is optional, since the TSV may simply provide a through-die connection through the substrate 205 without connecting to active circuitry 209 (e.g., to a device attached to bottomside 210 of TSV die 200).

The TSVs 216 comprise an outer dielectric sleeve 221 and an inner metal core 220, and a metal diffusion TSV barrier layer 222 between the outer dielectric sleeve 221 and the inner metal core 220. The TSVs 216 extends from the topside surface 207 to protruding TSV tip 217 emerging from the bottomside surface 210. The protective layer 231(b) is shown as a planarizing layer over protruding TSV tips 217. For example, in one particular embodiment the TSV tip ends 217(a) extend out about 5 µm from the bottomside surface 210, the metal caps 240 add about 5 µm in height to the TSV tips 217, the protective layer 231(b) thickness is in the range from 10 to 15 µm with first dielectric layer 231(a) being about 3 µm thick. In this particular embodiment, the protective layer 231(b) is about 3 to 8 µm above the metal caps 240 on the TSV tips 217.

Figure 3:
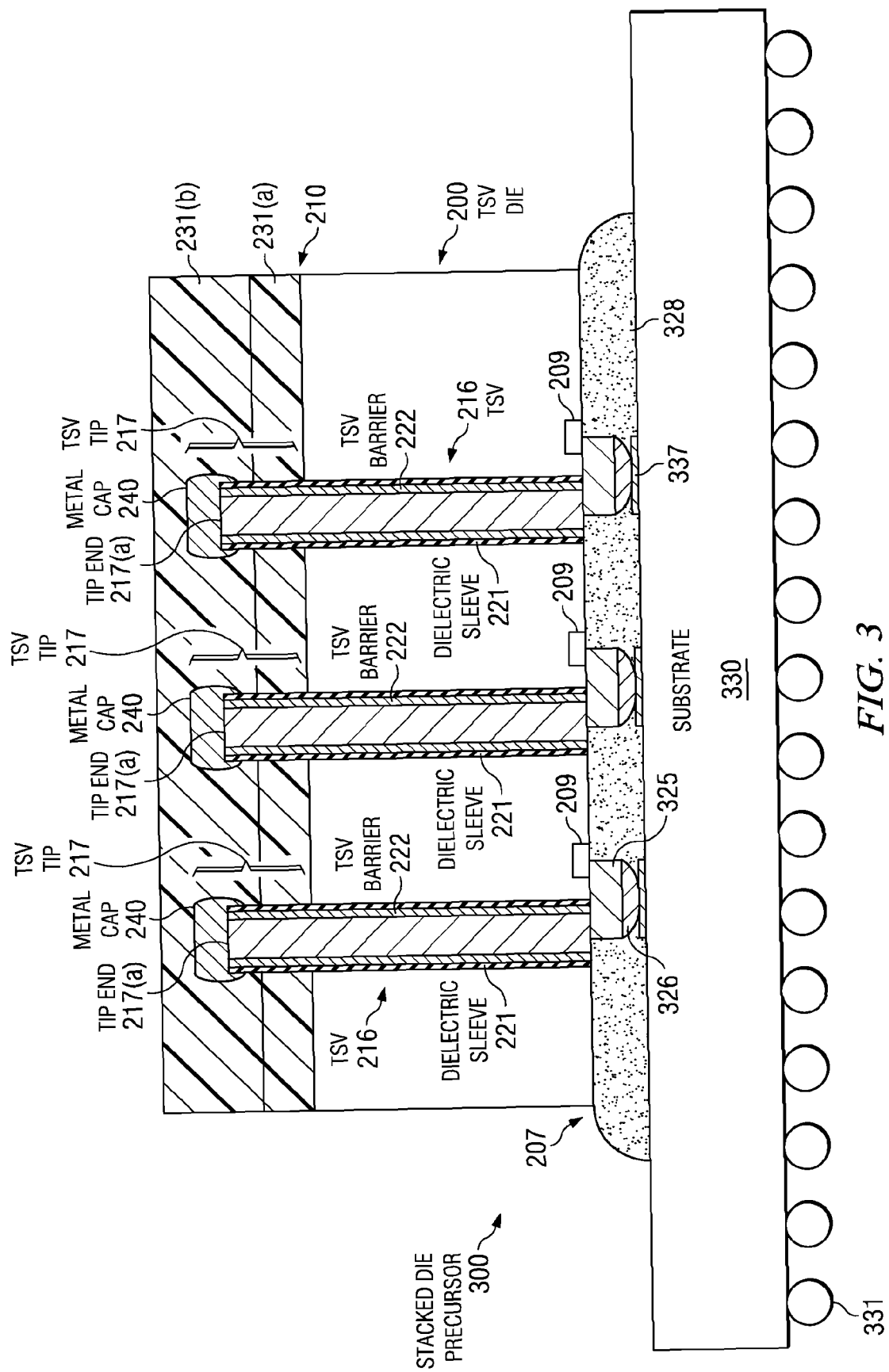
FIG. 3 shows an example protected stacked die precursor comprising the TSV die shown in FIG. 2 bonded to a workpiece, according to an example embodiment.

FIG. 3 shows an example protected stacked die precursor 300 comprising the TSV die 200 shown in FIG. 2 bonded to a workpiece shown as substrate 330, according to an example embodiment. The protected stacked die precursor 300 having TSV tips encapsulated enables shipping of such units with a reduced risk of damaging the TSV tips. TSV die 200 is bonded topside 207 down to pads 337 on substrate 330 that is shown as a package substrate (e.g., organic substrate). The package substrate can comprise a ceramic or an organic substrate, that may be thin (e.g., <350 µm). The package substrate is generally provided as a substrate panel (or strip). The assembling can comprise TC bonding.

The TSV die 200 is shown including pillars 325 that are capped with solder 326. Underfill 328 is shown between the TSV die 200 and the package substrate 330. The package substrate 330 is shown including a ball grid array (BGA) comprising a plurality of solder balls 331.

Protected stacked die precursor 300 shown in FIG. 3 can be used to form a stacked die device (e.g., system in package (SIP)) including TC bonding the stacked die precursor 300 to a workpiece. The protective layer 231(b) on the bottomside 210 of the TSV die 200 is partially or completely removed to expose the TSV tips 217 for subsequent bonding. A top IC die can be assembled onto the exposed TSV tips 217 of the TSV die 200. In one embodiment the top IC die comprises a memory die, and the TSV die 200 comprises a logic die.

In another embodiment the top die comprises an IC die stack comprising a plurality of stacked IC die that are bonded to one another. As described above, the reduced warpage of the TSV die 200 following TC bonding provided by the protective layer described above can also reduce failures with top die assembly onto the protruding TSV tips due to loss of co-planarity. Overmolding can follow, and then singulation to form a plurality of stacked die devices. When the workpiece comprises a package substrate, method can further comprise attaching a BGA of solder balls to the bottom of the workpiece before singulation.

The active circuitry formed on the substrate having a semiconductor surface comprises circuit elements that may generally include transistors, diodes, capacitors, and resistors, as well as signal lines and other electrical conductors that interconnect the various circuit elements to provide an IC circuit function. As used herein "provide an IC circuit function" refers to circuit functions from ICs, that for example may include an application specific integrated circuit (ASIC), a digital signal processor, a radio frequency chip, a memory, a microcontroller and a system-on-a-chip or a combination thereof. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

I claim:

1. A protected stacked die precursor, comprising:
a workpiece including a workpiece surface having a plurality of contact pads thereon;
a through substrate via (TSV) die including a substrate having a topside including active circuitry and bonding features on said topside, a bottomside, and a plurality of TSVs comprising a metal inner core that reaches from said topside to protruding TSV tips that extend out from said bottomside, and
a protective layer on said bottomside of said TSV die that extends over said protruding TSV tips, wherein said bonding features of said TSV die are bonded to said plurality of contact pads on said workpiece surface and wherein said TSV tips include a metal cap thereon comprising at least one metal layer that includes a metal that is not in said inner metal core.

2. The protected stacked die precursor of claim 1, wherein said workpiece comprises an organic substrate.

3. The protected stacked die precursor of claim 1, wherein said protective layer is a blanket layer that substantially planarizes said bottomside of said TSV die.

4. The protected stacked die precursor of claim 1, wherein said inner metal core comprises copper and TSV tips include a metal cap thereon that includes at least one of titanium, nickel, palladium, and gold.

* * * * *